United States Patent [19]

Plummer

[11] 4,199,774
[45] Apr. 22, 1980

[54] MONOLITHIC SEMICONDUCTOR SWITCHING DEVICE

[75] Inventor: James D. Plummer, Mountain View, Calif.

[73] Assignee: The Board of Trustees of the Leland Stanford Junior University, Stanford, Calif.

[21] Appl. No.: 943,200

[22] Filed: Sep. 18, 1978

[51] Int. Cl.² .................................................. H01L 7/02
[52] U.S. Cl. .................................. 357/41; 357/23; 357/55; 357/48; 307/304
[58] Field of Search .................... 357/41, 48, 55, 23; 307/304

[56] References Cited

U.S. PATENT DOCUMENTS

| | | | |
|---|---|---|---|
| 3,926,694 | 12/1975 | Cauge | 148/187 |
| 3,974,486 | 8/1976 | Curtis | 340/173 R |
| 3,996,655 | 12/1976 | Cunningham | 29/571 |
| 4,119,996 | 10/1978 | Jhabrola | 357/23 |
| 4,145,703 | 3/1979 | Blanchard | 357/55 |

*Primary Examiner*—Martin H. Edlow
*Attorney, Agent, or Firm*—Flehr, Hohbach, Test, Albritton & Herbert

[57] ABSTRACT

An electrical circuit device made in integrated monolithic form has low level operating characteristics of a MOS device and high level operating characteristics of a Triac. The structure includes two double diffused MOS transistors which have merged drain regions. At higher voltage and current levels a lateral Triac structure is triggered by the MOS devices. Alternatively, separate terminal contacts can be made to the P and N regions comprising the MOS transistor source and channel regions with the Triac triggered conventionally by an externally applied control voltage.

25 Claims, 20 Drawing Figures

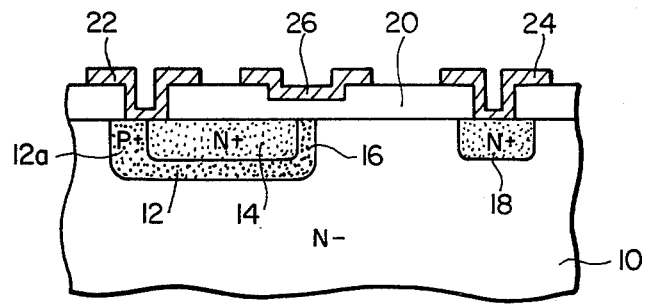
FIG__1
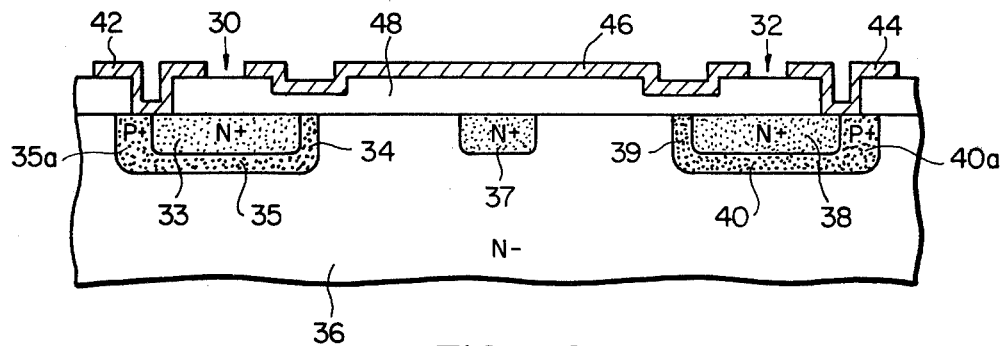
FIG__2
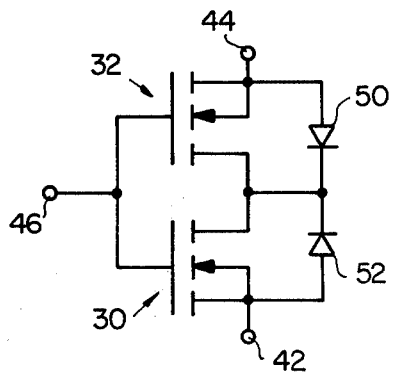
FIG__3A
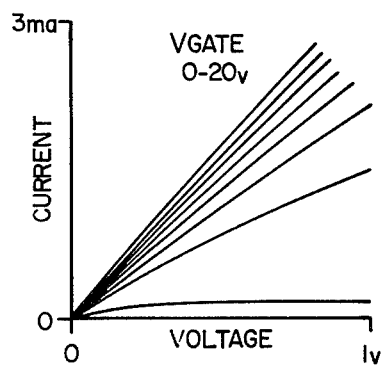
FIG__3B
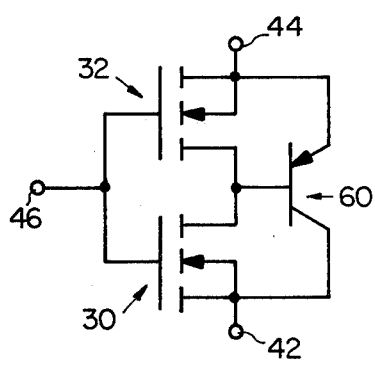
FIG__4A
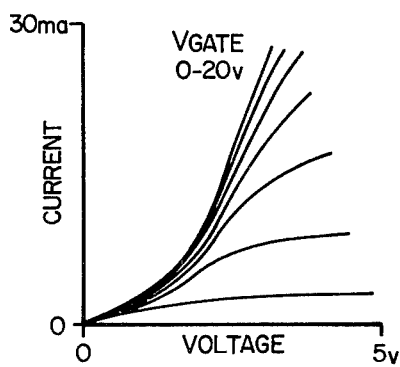
FIG__4B

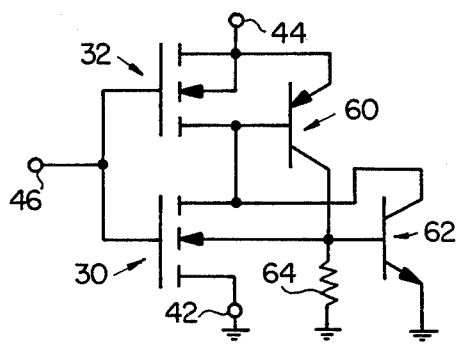
FIG_5A
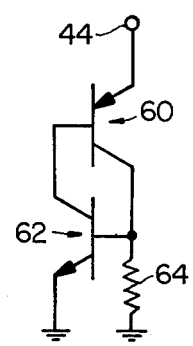
FIG_5B
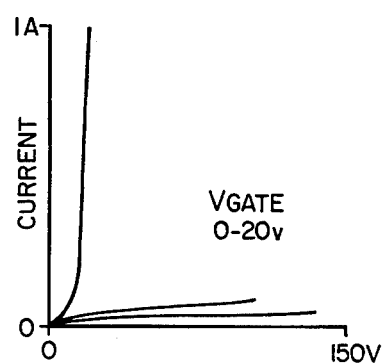
FIG_5C
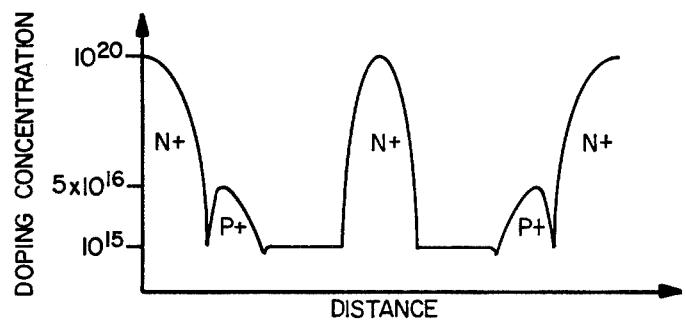
FIG_6
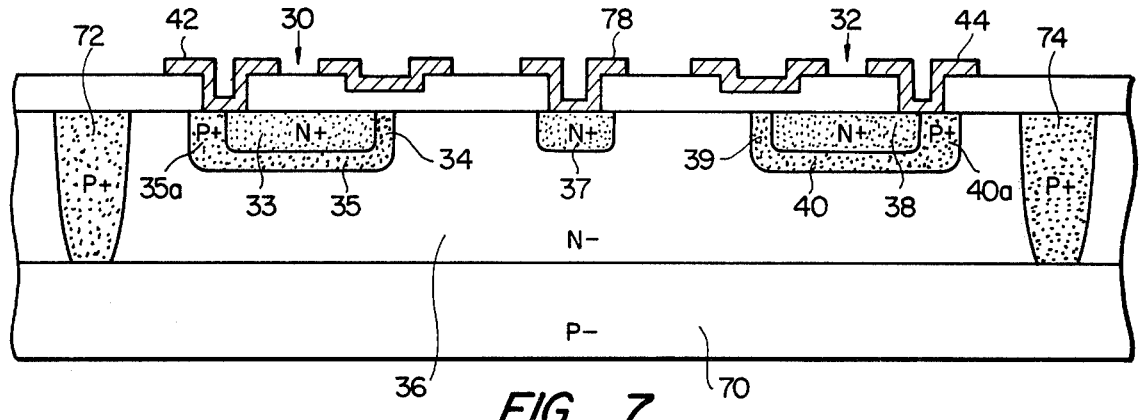
FIG_7
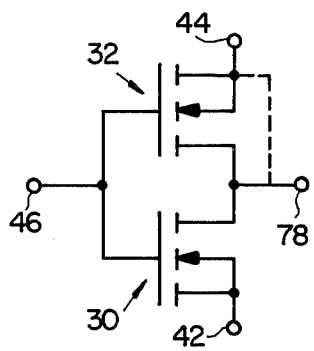
FIG_8A
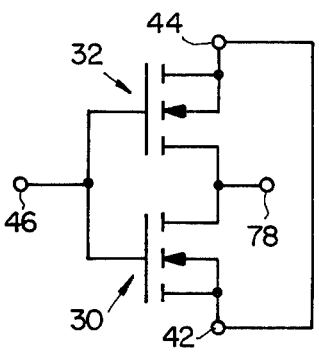
FIG_8B
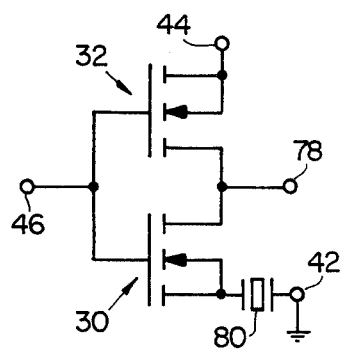
FIG_8C

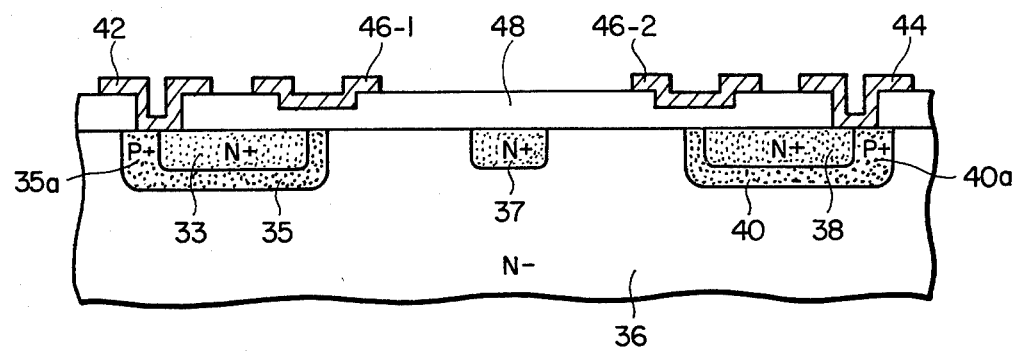
FIG_9
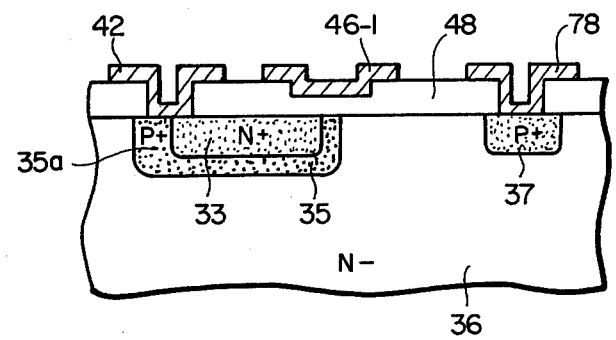
FIG_10
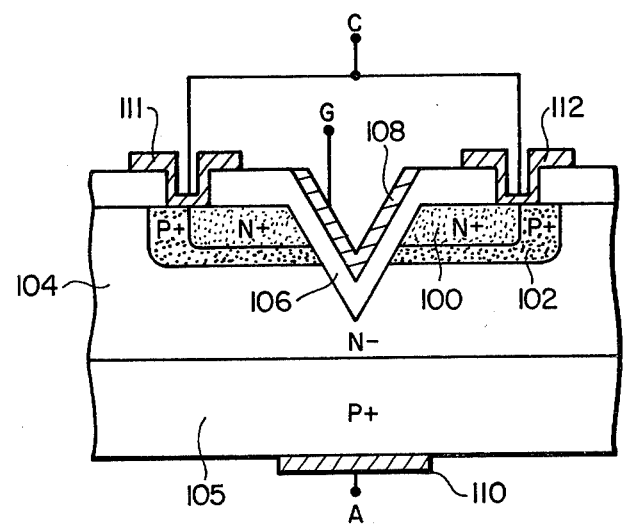
FIG_11

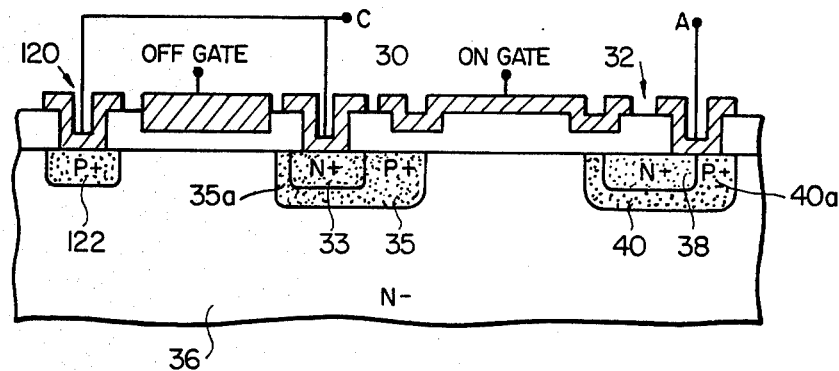
FIG_12
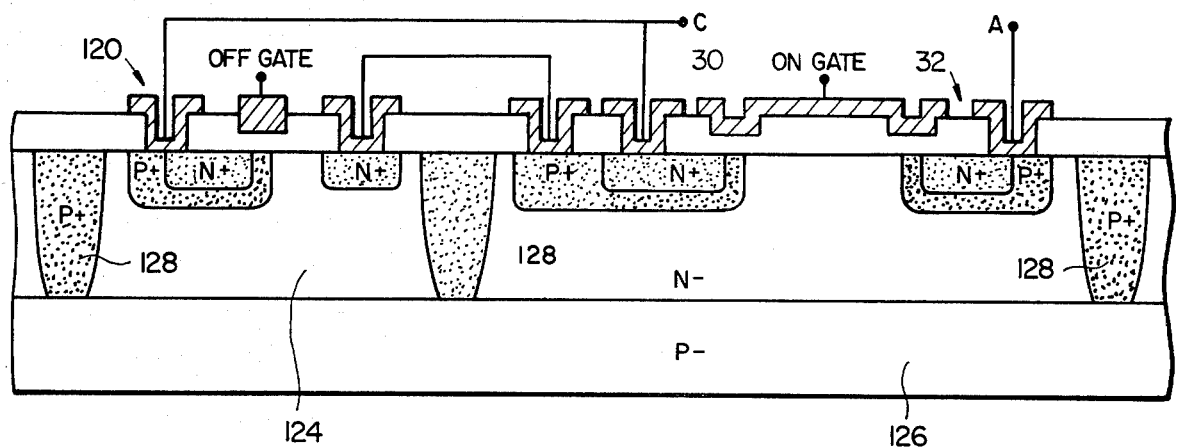
FIG_13
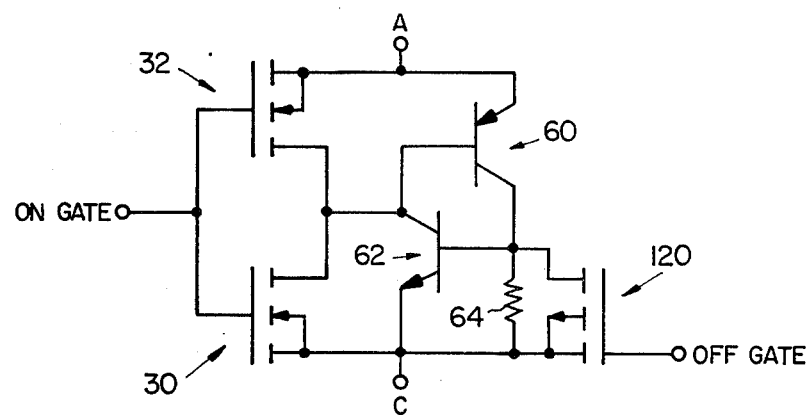
FIG_14

MONOLITHIC SEMICONDUCTOR SWITCHING DEVICE

BACKGROUND OF THE INVENTION

This invention relates generally to semiconductor circuits and devices, and more particularly the invention relates to an integrated circuit device having current dependent properties.

The metal oxide silicon (MOS) field effect transistor and the multijunction silicon controlled rectifier and Triac are known semiconductor devices which have current switching applications. The MOS transistor generally operates at lower voltages and current levels and can be used in linear applications. One form of MOS transistor is the double diffused device in which a very short channel region is defined by diffusing a region of one conductivity type in a substrate of opposite conductivity type and then diffusing a region of opposite conductivity type in the first region. The silicon controlled rectifier (SCR) or Triac is normally employed for higher voltage and current switching applications. The MOS transistor employs a field effect channel created by the application of a gate voltage, while the SCR typically is turned on by forward biasing a PN junction which renders the device conductive. The Triac is similar to the SCR but provides full wave switching.

SUMMARY OF THE INVENTION

An object of this invention is a new and improved current switching device.

Another object of the invention is an electrical circuit device which has the characteristics of an MOS transistor and of a full-wave silicon switch.

Still another object of the invention is a monolithic semiconductor device having operational characteristics which are current dependent.

A feature of the invention is a monolithic semiconductor device including two merged double diffused MOS transistors.

Briefly, a device in accordance with the invention comprises a semiconductor body having at least one major surface and a region adjacent to the surface of one conductivity. First and second spaced regions of opposite conductivity type are formed in the body region and abutting the major surface. Third and fourth regions of the one conductivity type are formed in the first and second regions, respectively, abutting the major surface and defining first and second channel regions in the first and second regions, respectively. A layer of insulation is formed on the major surface and an ohmic contact is formed on the layer of insulation and adjacent to the first and second gate regions. An ohmic contact is made to the first and third regions, and an ohmic contact is made to the second and fourth regions. An ohmic contact between the first and third regions and between the second and fourth regions may be facilitated by a separate diffusion of the same conductivity type as regions one and two adjacent to regions one and two. This diffusion is normally performed prior to diffusion of regions one and two, with a separate masking operation.

The first and third regions cooperatively function with the body region as a first double diffused MOS transistor, and the second and fourth regions cooperatively function with the body region as a second double diffused MOS transistor. The body region functions as a merged drain of the two transistors. A fifth diffused region of the same conductivity type as the body region can be formed in the body region between the first and second diffused regions.

At lower operating voltages and currents, the device functions as serially connected MOS transistors having merged drain regions, while at higher voltages and operating currents the device functions as a full wave silicon switch.

The invention and objects and features thereof will be more readily apparent from the following detailed description and appended claims when taken with the drawings.

BRIEF DESCRIPTION OF THE DRAWINGS

FIG. 1 is a cross section view of a conventional double diffused MOS transistor.

FIG. 2 is a cross section view of one embodiment of a switching device in accordance with the present invention.

FIG. 3A and FIG. 3B are an electrical schematic and voltage-current characteristics, respectively, of the device of FIG. 2 at lower operating voltages.

FIGS. 4A and 4B are an electrical schematic and voltage-current characteristics, respectively, of the device of FIG. 2 operated at higher voltage level.

FIG. 5A and FIG. 5B are an electrical schematic and voltage-current characteristics, respectively, of the device of FIG. 2 operated at still higher voltages.

FIG. 6 is the doping profile along the silicon surface of one embodiment of the device of FIG. 2.

FIG. 7 is a cross section view of another embodiment of a switch device in accordance with the present invention.

FIGS. 8A, 8B, 8C illustrate schematically several applications of the device of FIG. 7.

FIGS. 9-13 are cross section views of other embodiments of devices in accordance with the invention.

FIG. 14 is an electrical schematic of the device shown in FIGS. 12 and 13.

DETAILED DESCRIPTION OF THE ILLUSTRATED EMBODIMENT

Referring now to the drawings, FIG. 1 is a cross section view of a conventional double diffused MOS transistor (DMOS) formed in a lightly doped (N−) semiconductor body 10. The device includes a first P+ diffused region 12a, a second P diffused region 12 overlapping a portion of region 12a, a third N+ diffused region 14 formed in the P region 12 with all three regions being adjacent to a major surface of the semiconductor body 10. The N+ region 14 comprises the source of the transistor, and the portion 16 of P region 12 adjacent to the major surface and between the N+ region 14 and the N− body 10 comprises the transistor channel. An N+ diffused region 18 spaced from the first two regions along with the adjacent N− body region comprises the transistor drain. A silicon oxide layer 20 is formed on the major surface of the semiconductor body 10 with a metallic ohmic contact 22 made to regions 12, 12a and 14, a metallic ohmic contact 24 made to the drain region 18, and a metallic layer for the gate electrode 26 formed on the layer of insulation 20 above the channel region 16.

The device functions as a typical MOS transistor with a short channel region provided by the double diffused structure. However, due to the PN junction between region 12 and the body 10, the DMOS device is inherently asymmetrical; that is, the source and drain terminals are not interchangeable. This asymmetry can be a problem in many circuit applications, and a device in accordance with the present invention overcomes this limitation.

Referring now to FIG. 2, one embodiment of a device in accordance with the present invention is illustrated in cross section. The device is effectively two DMOS devices shown generally at 30 and 32 integrated in a monolithic semiconductor body 36 with merged drain regions. The DMOS transistor 30 comprises a source N+ region 33, a channel region 34 formed in P region 35 and a drain comprising the N— semiconductor body 36 and the N+ diffused region 37. DMOS transistor 32 comprises an N+ source 38, a P channel region 39 formed in P region 40, and a drain comprising the N— body 36 and the N+ diffused region 37. Regions 35a and 40a again are P+ diffused regions designed to facilitate ohmic contact to the P channel regions 35 and 40. One input-output (I/O) contact 42 is made to regions 33, 35 and 35a, a second I/O contact 44 is made to regions 38, 40 and 40a, and a gate electrode 46 is formed on the silicon oxide layer 48 above the channel regions 34, 39.

Due to the symmetrical construction of the device as shown in FIG. 2, the device has symmetry of operation, i.e. the two I/O contacts are interchangeable. Importantly, the operational characteristics of this device change with the operating voltage and current levels.

FIG. 3A is an electrical schematic of the device in FIG. 2 operated at low voltage and current levels (e.g. less than one volt across the device, gate voltage of a few volts above the threshold voltage), and FIG. 3B is the current-voltage operating characteristics of the device of FIG. 3A. In FIG. 3A the two DMOS transistors 30 and 32 are shown serially connected with the I/O terminals 42, 44 connected to the source regions of transistors 30 and 32, respectively, and gate terminal 46 controlling the gates of both transistors. Diode 52 formed by P region 35 and the N— body 36 is connected in parallel with transistor 30, and diode 50 formed by P region 40 and the N— body 36 is connected in parallel with transistor 32. Thus, since the two diodes are provided in series opposition, the device in accordance with the present invention is symmetrical at lower voltage and current operation. FIG. 3B is a plot of current vs. voltage for low level operation wherein the device functions in accordance with the circuit illustrated in FIG. 3A.

For applied voltages greater than approximately 1.5 volts (gate voltage of a few volts above the threshold voltage), holes are injected into semiconductor body 36 by the plus voltage on P regions 40 and 40a, with P regions 40 and 40a and 35 and 35a functioning with the N— semiconductor body 36 as a PNP transistor 60 connected as shown in FIG. 4A. Referring to the plot of voltage vs. current in FIG. 4B, the transconductance or gain of the device shows a sharp increase. However, the device remains symmetrical. The increase in transconductance or device gain can be attributed to the injected holes from regions 40 and 40a which pass through body 36 and are collected at regions 35 and 35a. These collected holes contribute to the total device current (which is measured externally) and thus increase the transconductance or device gain. Some of the injected holes recombine with majority carriers in the N— region while the remaining injected holes are collected at regions 35 and 35a. Thus, applied voltages greater than approximately 1.5 volts cause the lateral PNP transistor to turn on. The current contributed by this device explains the increase in overall device gain as demonstrated by the plot in FIG. 4B. In this mode of operation two parallel conduction paths are provided in the device, electron flow through the surface DMOS devices and hole current through the lateral PNP transistor. The overall device current is the sum of the DMOS electron current and the injected hole current.

By increasing current flow through the device by increasing gate voltage, for example, an applied voltage of +2 volts on one I/O terminal and a +10 volt gate potential, the device assumes an electrical and equivalent electrical schematic as demonstrated in FIGS. 5A and 5B, with the other I/O terminal grounded. In this mode of operation the device assumes the characteristics of a Triac with switching action to a low resistance device, similar to that observed in PNPN four layer structures. The structure shown in FIG. 2 can be viewed as a lateral NPNPN structure, or a symmetrical PNPN arrangement, between the two I/O terminals. As illustrated in FIG. 5A, an NPN transistor 62 formed by regions 33, 35 and 36 of the structure in FIG. 2, is added to the circuit of FIG. 4B with transistor 62 shunting DMOS transistor 30. Both electrons and holes continue to contribute to the overall device current, however, the holes collected by the P region 35 (FIG. 2) flow through a relatively high resistance before reaching the I/O contact 42. This resistance is denoted 64 in the schematic of FIG. 5A, and is physically analogous to the base resistance in a bipolar transistor and is an inherent part of the DMOS structure. The resistance is a distributed resistor and holes are collected all along its length. The voltage drop along the resistor will tend to forward bias the PN+ junction (region 35, 33) which is the base-emitter junction of the NPN transistor whose collector is the N— body 36. Once the voltage differential turns the NPN transistor on (at approximately 0.7 volts) a regenerative switching causes the four layer structure comprising the two bipolar transistors to switch to a low resistance state, which is illustrated in FIG. 5B. Transistors 60 and 62 are equivalent to the arrangement of PNP and NPN devices used in conventional Triacs and SCRs.

It should be noted that the Triac or SCR is switched by applying a trigger voltage from an external source. While the device as illustrated in FIG. 2 is triggered to a low resistance state when the current through the device is increased by increasing the gate voltage, the device can be made to operate as a conventional SCR by forward biasing a junction. If separate ohmic contacts are formed to regions 35a and 33, externally forward biasing the P+N+ junction between regions 35a and 33 will switch the device to its low resistance state. However, the device illustrated in FIG. 2 is switched to a low resistance mode by an MOS device in parallel with the Triac and not by forward biasing the junction externally, as is found with the conventional Triacs and SCRs. At low current levels before the Triac fires, the MOS characteristics of the structure dominate. After firing the Triac, the device becomes a low resistance device.

FIG. 6 illustrates the surface doping profile for one switch device in accordance with the present invention. Absolute surface doping concentration is illustrated along the ordinate and distance across the device is illustrated along the abscissa. Relating the doping concentration to the device illustrated in cross section in FIG. 2, the N+ regions 33, 37 and 38 have a dopant concentration on the order of $10^{20}$ impurities per cubic centimeter. The P regions which comprise the channel regions of the two DMOS transistors 34, 39 have a peak dopant concentration on the order of $5 \times 10^{16}$ impurities per cubic centimeter. The dopant concentration of the N− semiconductor body is on the order of $10^{15}$ impurities per cubic centimeter.

In fabricating the device, P+ diffusions are first formed to facilitate ohmic contact to the DMOS transistor channel regions. Then sequential diffusions of boron (P type) and phosphorus or arsenic (N type) are made employing conventional diffusion techniques to form the P and N+ regions. Ion implantation may also be advantageously used to introduce the boron (P type) impurity for the channel region of the devices. The gate oxidation is then formed over the channel regions, contact holes are made for the I/O contacts, metal is formed over the surface of the device and the metal pattern is defined by conventional photoresist masking and etching techniques.

The maximum doping in the P region at the surface under the gate along with the gate oxide thickness and the oxide charge density determine the DMOS threshold voltage. The channel width largely determines the DMOS transconductance and on resistance. The channel width also affects the Triac trigger current because the Triac is triggered by a specific current density flowing through the device. The DMOS properties are largely independent of the channel length.

The channel doping profile determines directly the DMOS threshold voltage. In addition, the current density at which switching to the low resistance mode of operation occurs is affected by this profile.

The doping level in the N− semiconductor body affects the device breakdown voltage, the DMOS on resistance and the lateral PNP transport efficiency.

The N+ drain region in the middle of the device is important in order to increase the breakdown voltage. If this diffused region is not included a parasitic P channel MOS transistor across the surface will reduce the breakdown voltage to the field oxide threshold voltage which is typically 20 to 40 volts. In addition, this N+ region increases the lateral PNP transport efficiency. The lateral dimension of the N+ region should be minimized as it degrades the PNP transport efficiency.

Referring now to FIG. 7, several modifications to the device shown in cross section in FIG. 2 are made. The same numerals are given to like elements. The semiconductor body region 36 in this embodiment comprises an epitaxial layer formed on a P− substrate 70. The structure may comprise a plurality of switching devices with each device isolated by means of diffused P+ regions 72 and 74 which extend through the epitaxial layer 36 to the underlying substrate 70 and surround the device. However, it is noted that a P+ substrate collects injected holes thus delaying the turn-on of the Triac lateral structure. Experimental results indicate that depending upon device geometry 10% to 50% of the injected holes are collected by the substrate before the Triac fires. While this does affect the efficiency of the device at higher voltage and current levels, the efficiency of the device is not affected at low voltage and current levels when all of the device current is carried by the MOS transistors. By adding an N+ buried layer between the N− epitaxial layer and the P− substrate, a reduction in injected holes captured by the substrate would be effected. Such buried layers are commonly employed in commercial integrated circuits and are readily acapted in standard production techniques. Additionally, dielectric isolation techniques can be employed instead of diffused isolation as shown in FIG. 7. By employing dielectric isolation the P− substrate of FIG. 7 can be replaced with an insulator, and consequently injected holes are not collected by the substrate. Alternatively, the P+ diffused regions, 72, 74 can be replaced by a dielectric such as silicon oxide.

The N+ region 37 spaced from the two double diffused regions is not necessary for low voltage Triac operation and it can be eliminated if the device is not operated at high voltages. By eliminating this N+ region, the base width of the lateral PNP transistor can be reduced, resulting in lower triggering currents for the Triac and lower on resistance for the DMOS device. However, as indicated above the elimination of the N+ region creates a parasitic PMOS transistor between the two P diffused regions thus limiting the device breakdown voltage.

The separate ohmic contact made to the N+ region 37 as illustrated in FIG. 7 allows more versatility in operation of the device. The device can still be operated as a switching device as above described and as illustrated schematically in FIG. 8A. The N+ connection 78 can be left floating or can be connected to the +V potential applied to terminal 42. By connecting the terminal to the +V potential, the DMOS characteristics will dominate up to a higher voltage and current level before the device becomes a low resistance switch.

Alternatively, as shown schematically in FIG. 8B the device can be used as a standard DMOS transistor over its full operating range by connecting terminals 42 and 44 together as the source, and the N+ contact 78 becomes the drain.

In FIG. 8C, the device is used as a high level analog switch wherein a transducer 80 is driven at a high voltage with the transducer also used as part of a receiver. In this application the Triac capability is used with the transmitter, and the single DMOS capability is used with a receiver. Such a circuit would have application in an ultrasonic imaging system, or other applications involving transmit-receive switching.

FIG. 9 is a cross section view of another embodiment of a device in accordance with the present invention. In this embodiment the gate metallization is split into two separate gate contacts 46-1 and 46-2. This structure allows separate control of the firing of the device in the first and third quadrants of the device I-V characteristics. When the terminal 44 is positive (the anode) gate 46-1 is used to trigger the device. When the terminal 42 is positive (the anode), gate 46-2 is used to trigger the device. This configuration is useful in minimizing high oxide electric fields between the anode and the gate.

FIG. 10 is a cross section view of another embodiment of the device in accordance with the present invention. In this embodiment a single double diffused region comprising the N+ region 33 and P region 35 is provided along with a P+ diffused region 37. Contact 42 is made to regions 33 and 35, usually with the addition of P+ region 35a, a gate contact 46-1 is made over oxide 48, and an ohmic contact 78 is made to the P+ region 37. This structure forms an MOS controlled silicon controlled rectifier and operates in the same mode as the device of FIG. 2 except that it is not symmetrical. Contact 78 must always be the anode and contact 42 must always be the cathode. The device has high input impedance on the control electrode 46-1, and good isolation is provided between the control and signal paths.

FIG. 11 is a cross section view of another device in accordance with the present invention which also functions as an MOS controlled silicon controlled rectifier. Double diffused regions 100 and 102 are formed in N− epitaxial layer 104, and anisotropic silicon etching is employed to form a V groove through the regions 100 and 102 into the epitaxial layer 104. An oxide layer 106 is thermally grown or deposited in the V groove and a gate contact 108 is formed thereover. An anode contact 110 is made to the P+ substrate 105, the contacts 111 and 112 to the double diffused regions are connected in parallel as the cathode, and contact 108 is the gate. In this device current flows vertically.

FIG. 12 and FIG. 13 are cross section views of a device similar to the device of FIG. 2 and in which an additional MOS transistor is added to achieve a turnoff capability. In FIG. 12 the added MOS transistor is provided by a diffused P+ region 122 which is spaced from the P+ region 35a with the N− substrate region therebetween functioning as a channel region of an MOS transistor. The gate electrode to transistor 120 is the off gate, and the gate electrode to the merged transistor 30 and 32 is the on gate.

FIG. 13 is a similar structure in which the device is formed in an N− epitaxial layer 124 on a P− substrate 126 with P+ isolation regions 128 diffused through the epitaxial layer 124. In this embodiment the added transistor 120 is isolated from the merged transistor structure and comprises a double diffused MOS transistor (DMOS).

FIG. 14 is the equivalent electrical schematic of the devices illustrated in FIG. 12 and FIG. 13 and is similar to the electrical schematic of FIG. 5A with the addition of the transistor 120 and off gate. When the off gate is turned on, the MOS transistor 120 effectively shorts out the base-emitter junction of the NPN transistor 62 thus bringing the transistor out of saturation. This causes the overall device to transfer from its low impedance regenerative condition and, provided the on gate is not turned on, will shut the device completely off thereby stopping anode current. This is a unique capability for a Triac type structure and is especially attractive because a high impedance MOS input is used to turn the device off. In addition, an off switch may be included on the anode (A) side of the device to enable it to be switched off when the anode and the cathode are reversed. This makes the overall device symmetric. Additionally, the transistor 120 may be used as a variable resistor to electronically vary the current at which the device switches to a low impedance regenerative condition. It will be appreciated that in a junction isolated or dielectrically isolated structure, the device in accordance with the present invention may be fabricated along side other components as technology in fabricating the device is compatible with the fabrication of other semiconductor devices.

The switching device in accordance with the present invention has a number of applications including analog multiplexers with high current "boost" capability, high voltage display driving, telephone cross point switches, and in power control applications.

Thus, while the invention has been described with reference to specific embodiments and applications, the description is illustrative of the invention and is not to be construed as limiting the invention. It will be appreciated that various manufacturing techniques are known for fabricating the devices and equivalent structures can be fabricated. For example, while the ohmic contacts are described as metallic, other contacts such as doped polysilicon can be employed. Thus, various applications, changes, and modifications may occur to those skilled in the art without departing from the true spirit and scope of the invention as defined by the appended claims.

What is claimed is:

1. A monolithic semiconductor device comprising:
   a semiconductor body having at least one major surface and
   a body region adjacent to said surface of one conductivity type, first and second spaced regions of opposite conductivity type formed in said body region and abutting said major surface, third and fourth regions of said one conductivity type formed in said first and second regions, respectively, abutting said major surface and defining first and second channel regions in said first and second regions, respectively,
   a layer of insulation on said major surface,
   a gate electrode formed on said layer of insulation and above said first and second channel regions, an ohmic contact to said first and third regions, and an ohmic contact to said second and fourth regions.

2. A monolithic semiconductor device as defined by claim 1 and further including a fifth region of said one conductivity type formed in said semiconductor body between and spaced from said first and second regions.

3. A monolithic semiconductor device as defined by claim 2 wherein said one conductivity type is N type and said opposite conductivity type is P type.

4. A monolithic semiconductor device as defined by claim 2 and including an ohmic contact to said fifth region.

5. A monolithic semiconductor device as defined by claim 1 wherein said body region of said semiconductor body comprises an epitaxial layer.

6. A monolithic semiconductor device as defined by claim 5 wherein said semiconductor device is electrically isolated by an isolation region through said epitaxial layer and surrounding said device.

7. A monolithic semiconductor device as defined by claim 6 wherein said isolation region comprises a diffused region.

8. A monolithic semiconductor device as defined by claim 6 wherein said isolation region comprises a dielectric material.

9. A monolithic semiconductor device as defined by claim 6 wherein said semiconductor body includes a plurality of like semiconductor devices which are spaced and isolated from said one device by said isolation region.

10. A monolithic semiconductor device as defined by claim 1 wherein said semiconductor body comprises a semiconductor substrate of said opposite conductivity type, said body region comprises an epitaxial layer of said one conductivity type formed on said substrate, said first and second regions are spaced apart by a V-groove formed in said major surface and further including a layer of insulation over the surface of said V-groove and a gate electrode formed over said layer of insulation and spaced from said surface of said V-groove.

11. A monolithic semiconductor device as defined by claim 1 and further including a fifth region of said opposite conductivity type abutting said major surface and spaced from said first region, an insulating layer overlying said major surface between said first and fifth regions, and a gate electrode formed on said insulative layer.

12. An electrical circuit device comprising:
a first double diffused field effect transistor having source, gate, and drain regions,
a second double diffused field effect transistor having source, gate, and drain regions,
means ohmically connecting said drain regions,
contact means for said gate regions,
an ohmic contact to said source region of said first field effect transistor, and
an ohmic contact to said source region of said second field effect transistor.

13. An electrical circuit device as defined by claim 12 wherein said first and second field effect transistors are formed in a semiconductor body and said means ohmically connecting said drain regions comprises a region of said semiconductor body.

14. An electrical circuit device as defined by claim 13 wherein said source and drain regions are N type, and said channel regions are P type.

15. An electrical circuit device as defined by claim 13 wherein said semiconductor body includes an epitaxial layer and said first and second field effect transistors are formed in said epitaxial layer.

16. An electrical circuit device as defined by claim 15 and including an isolation region extending through said epitaxial layer and surrounding said first and second field effect transistors.

17. A monolithic semiconductor device as defined by claim 16 wherein said isolation region comprises a diffused region.

18. A monolithic semiconductor device as defined by claim 16 wherein said isolation region comprises a dielectric material.

19. A monolithic body having a plurality of isolated semiconductor regions of one conductivity type abutting a major surface of said body, each region including an electrical device comprising
first and second spaced regions of opposite conductivity type,
third and fourth regions of said one conductivity type formed in said first and second regions, respectively, and defining first and second channel regions in said first and second regions, respectively,
a layer of insulation on the surface of said semiconductor region,
a gate electrode formed on said layer of insulation and adjacent to said first and second channel regions,
an ohmic contact to said first and third regions, and
an ohmic contact to said second and fourth regions.

20. A monolithic body as defined by claim 19 wherein said insulation layer comprises silicon oxide and said monolithic body comprises a silicon substrate.

21. A monolithic body as defined by claim 20 wherein said monolithic body further includes an epitaxial layer and said electrical device is formed in said epitaxial layer.

22. A monolithic body as defined by claim 21 wherein said isolation is provided by diffused regions through said ipitaxial layer of said opposite conductivity type.

23. A monolithic body as defined by claim 21 wherein said isolation is formed by dielectric material extending through said epitaxial layer.

24. A monolithic body as defined by claim 23 wherein said dielectric material is silicon oxide.

25. A monolithic semiconductor device comprising:
a semiconductor substrate of one conductivity type, an epitaxial layer of opposite conductivity type, said epitaxial layer having a major surface, isolation means extending through said epitaxial layer and defining at least two isolated regions in said epitaxial layer,
one of said isolated regions including
a first double diffused field effect transistor having source, gate, and drain regions,
a second double diffused field effect transistor having source, gate, and drain regions,
means ohmically connecting said drain regions,
contact means for said gate regions,
an ohmic contact to said source region of said first field effect transistor, and
an ohmic contact to said source region of said second field effect transistor,
another of said isolated regions including
a third field effect transistor having source, gate, and drain regions, and
means electrically connecting said source region of said third transistor and said source region of said second transistor, said source region of said first transistor functions as an anode, said connected source regions of said second and third transistor function as a cathode, said gate regions of said first and second transistors function as an on gate, and said gate of said third field effect transistor functions as an off gate.

* * * * *